United States Patent [19]

Schroeder

[11] 4,438,181

[45] Mar. 20, 1984

[54] ELECTRONIC COMPONENT BONDING TAPE

[75] Inventor: Jon M. Schroeder, 4327 Estate Dr., Stockton, Calif. 95209

[73] Assignee: Jon M. Schroeder, Stockton, Calif.

[21] Appl. No.: 224,668

[22] Filed: Jan. 13, 1981

[51] Int. Cl.³ .......................................... H01L 23/48
[52] U.S. Cl. .................................. 428/571; 428/596; 357/70
[58] Field of Search ..................... 228/5.1, 6 A, 10.4, 228/106, 160, 180 A; 428/572, 573, 596, 597, 620; 361/421; 357/70; 174/52 FP

[56] References Cited

U.S. PATENT DOCUMENTS

| | | | |
|---|---|---|---|
| 3,440,027 | 4/1969 | Hugle | 357/70 |
| 3,698,074 | 10/1972 | Helda | 357/70 |
| 3,803,709 | 4/1974 | Beltz | 357/70 |
| 3,821,785 | 6/1974 | Rose | 357/71 |
| 3,832,769 | 9/1974 | Olyphant | 357/70 |
| 3,838,984 | 10/1974 | Crane | 357/70 |
| 3,868,724 | 2/1975 | Perrino | 357/70 |
| 3,902,148 | 8/1975 | Drees | 357/70 |
| 4,209,355 | 6/1980 | Burns | 357/70 |
| 4,210,926 | 7/1980 | Hacke | 357/70 |
| 4,259,436 | 3/1981 | Tabuchi | 357/70 |
| 4,308,339 | 12/1981 | Lindberg | 357/70 |
| 4,312,926 | 1/1982 | Burns | 357/70 |
| 4,331,831 | 5/1982 | Ingram | 357/70 |

FOREIGN PATENT DOCUMENTS 54-140465 10/1979 Japan .................................. 357/70

Primary Examiner—L. Dewayne Rutledge
Assistant Examiner—J. J. Zimmerman
Attorney, Agent, or Firm—Donald E. Schreiber

[57] ABSTRACT

A preformed metallic tape for thermocompression bonding to electronic component chips and a method and apparatus for the use thereof. The tape has etched thereinto a chip bonding site which includes a central, pull-tab region surrounded by a frame region. Intermediate the pull-tab and the frame regions, electrically conductive leads are formed and connected to the pull-tab. Several of the leads are further connected to the frame. The leads are formed with neck regions located respectively between their ends and the pull-tab and frame. One surface of the tape is a bonding surface and the opposite surface is a pressure pad surface. Protruding above the pressure pad surface are a plurality of mushroom-shaped pressure pads located respectively at the ends of leads. The tape is bonded to a chip by first aligning mating electrical contact pads thereof and terminal ends of the leads. The pads are then urged into the tape so that the pressure pads located on the opposite side thereof contact a heated anvil. Thus, the leads and chip pads are heated and softened permitting a force applied thereto by the pressure pads to form an electrically conductive bond therebetween. The same process may then be used to bond the other ends of the leads to either a lead frame or a chip carrier frame. The leads may then be electrically isolated by first adhering an adhesive tape to the exposed surface of the pull-tab region. Withdrawal of the tape then breaks the leads at their respective neck regions.

7 Claims, 12 Drawing Figures

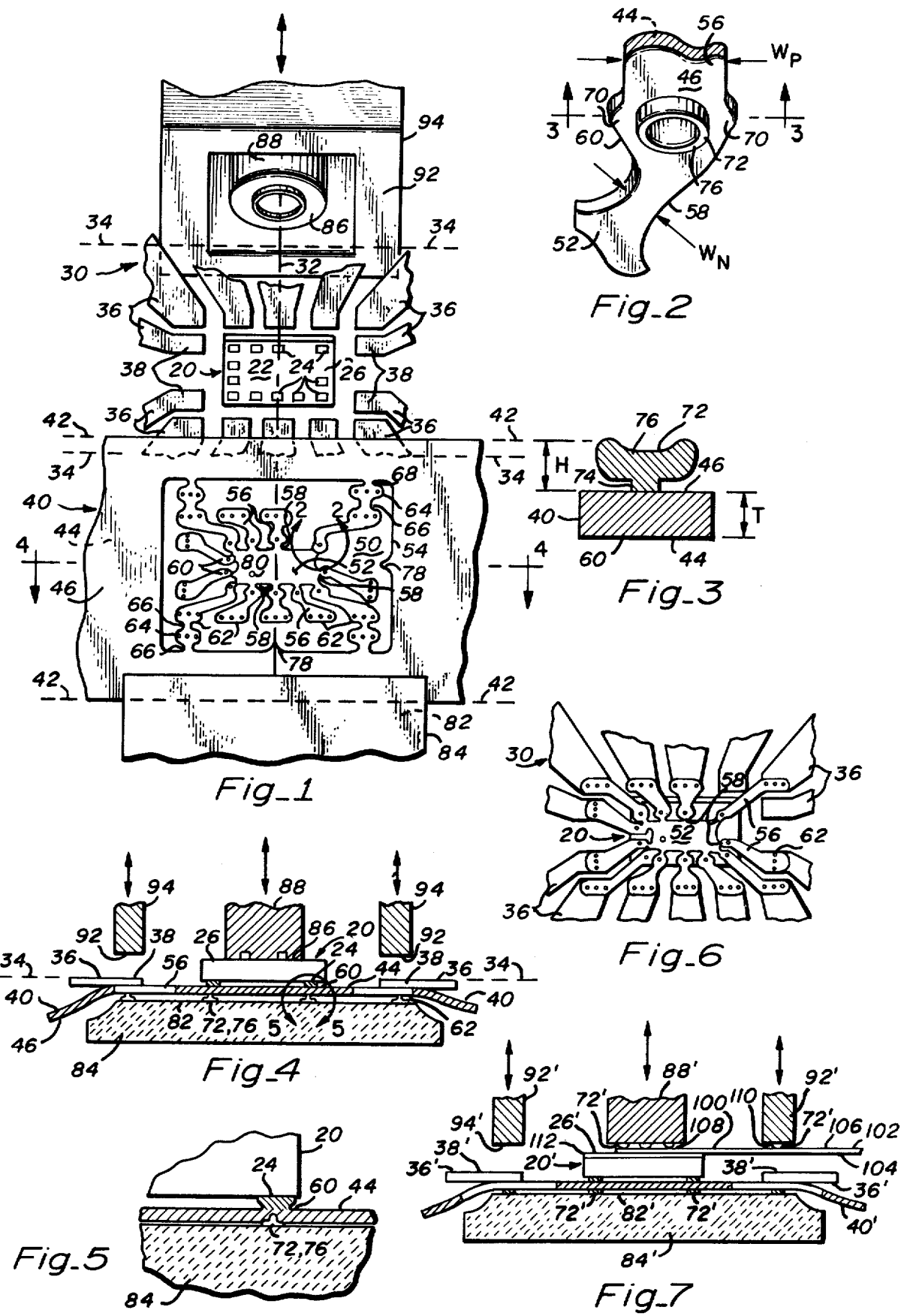

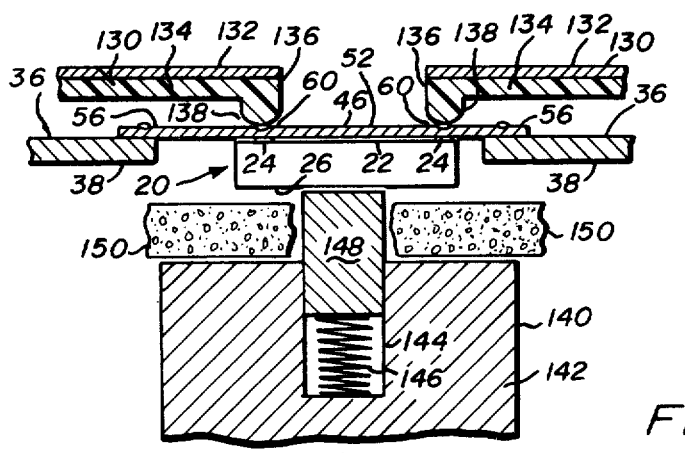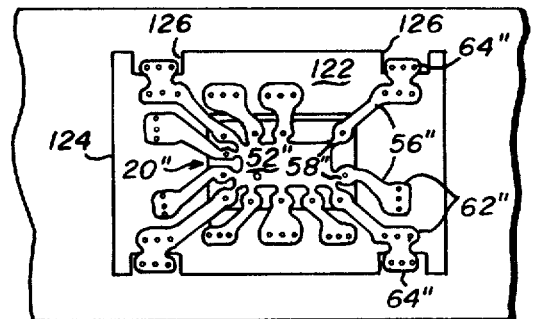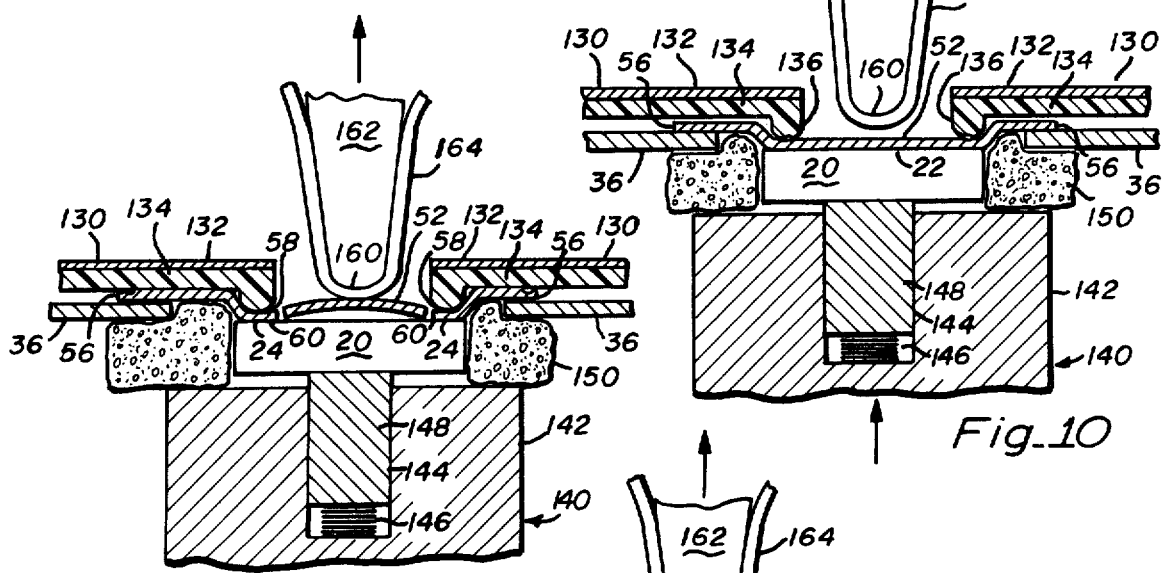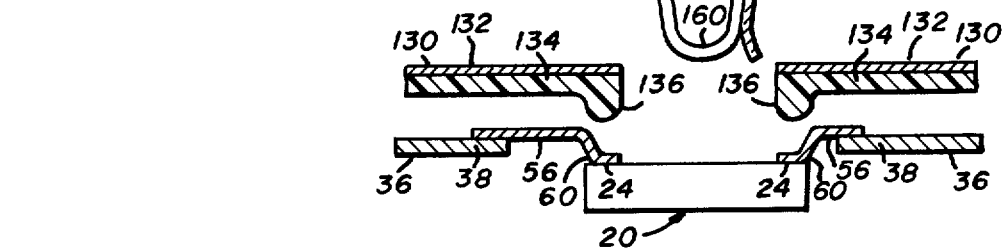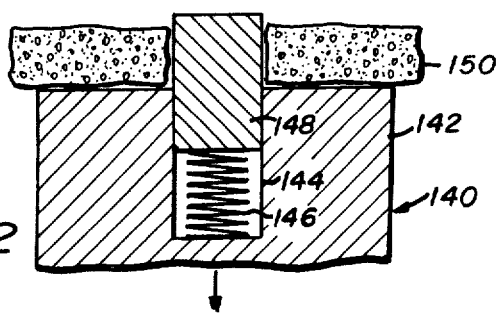

ELECTRONIC COMPONENT BONDING TAPE

BACKGROUND THE INVENTION

1. Field of the Invention

The present invention relates generally to the assembly of micro-electronic devices and more particularly to thermocompression bonding of electrically conductive leads.

2. Description of the Prior Art

Various types of electronic components and even entire electronic circuits incorporating thousands of components are routinely manufactured in the form of an electronic component chip. Such chips generally have a central region containing electronic components which are, in many cases, electrically interconnected to form an entire electronic circuit. Electrical currents generally are introduced into and/or drawn from such components and/or circuits by means of electrical contact pads formed on the chip. These pads, which are electrically connected to the components and/or circuit on the chip, are generally square-shaped measuring between three and seven thousandths of an inch along an edge and are generally located along edges of the central region. However, due to the small size of the electrical contact pads and also because the electronic component chip may be easily damaged, larger and more rugged electrically conductive leads are generally permanently attached to these pads before the chip is placed in service.

U.S. Pat. Nos. 3,698,073, 3,698,074, 3,698,075 and 3,698,076 each relate to a method and apparatus whereby electrically conductive leads may be attached to the electrical contact pads of an electronic component chip. The technique taught by these patents employs a first, preformed lead frame fabricated from a strip of aluminum or copper having a thickness of about 1.5 to 4.0 thousandths of an inch. Electrically conductive leads preformed at the center of this strip are ultrasonically bonded to the electrical contact pads of an electronic component chip. Then these lead frames to which the chip is now bonded are attached to adhesive tape so that the outer, electrically shorting portions of the lead frame may be removed without damaging the leads bonded to the chip. The chips together with the leads from the frame remain secured to the tape which may then be wound onto a reel for sale or transport to another work position. Alternatively, the leads or a second, more rigid frame may be bonded to the leads of the first frame after which the chip and leads of the first frame may be removed from the adhesive tape. This second frame, to which the electronic component chip is now secured by means of the intermediate electrically conductive leads of the first frame, may be constructed of Kovar, nickel, copper, steel, or other suitable material having a thickness of six to twelve thousandths of an inch. This second lead frame is employed to provide leads having sufficient mechanical strength for ordinary handling and joining such as to printed circuit boards. A similar, commercially marketed technique for electronic component chip bonding employs a first lead frame fabricated in either a single-layer copper or a two-layer polyimide/copper preformed tape.

A difficulty with these prior techniques is that their apparent simplicity has not been realized in a manufacturing environment. For example, the fragile electrically conductive leads of the first preformed metallic tape must generally be protected by means of a backing web of insulating material. Similarly, the tools generally required to form the bonds between the electrically conductive leads and the electrical contact pads of the electronic component chip are complicated. For example, U.S. Pat. No. 3,698,075 teaches the use of ultrasonic bonding for this purpose wherein the pedestal against which the tape is pressed during bonding must be specially formed to have a relief portion in those areas where contacts are not to be formed and that its surface must be vapor honed in order to function properly. Also, the prior art techniques have often required either additional chip processing steps and/or specially shaped structures and complicated metallurgy at the terminal ends of the electrically conducted leads. Thus, it has been found necessary either to add an extra wafer-processing step to form a structure which prevents the pad from collapsing in normal thermocompression or alloy-type bonding or alternatively, the ends of the leads must be etched to form a bump thereon to mate with and contact the pad. Similarly, it has generally been found necessary to incorporate a layer of soft precious metal such as gold into the junction between the electrical contact pad and the electrically conductive leads in order to secure a bond which resists damage from temperature changes.

Another problem in bonding electrically conductive leads to electronic component chips left unsolved by prior art techniques is that of substrate bonding. Bonding an electrically conductive lead to the substrate into which and/or onto which the components and/or circuit are formed is frequently required for proper electrical operation of chips such as semiconductor integrated circuit chips. Since the substrate is most easily accessed only on the surface of the chip opposite to that on which the electrical contact pads are located, attachment of a lead thereto has not been previously accomplished with a method and apparatus for bonding preformed metallic tapes.

SUMMARY OF THE PRESENT INVENTION

An object of this invention is to provide an improved method for bonding electrically conductive leads to an electrical contact pad of an electronic component chip.

Another object is to provide a means for bonding thin electrically conductive leads which does not require the use of insulating backing tape.

Another object is to provide a means for forming a bond between electrically conductive leads and electronic component chips which does not require a layer of precious metal therein.

Still another object is to provide a means for bonding electrically conductive leads to electronic component chips which does not require additional contact pad processing operations.

Another object is to provide a means for bonding electrically conductive leads to electronic component chips which does not require leads having a specially formed bonding surface.

A further object is to provide a means for bonding electrically conductive leads to electrical contact pads wherein the same material is used for both the leads and the pads.

Yet another object of the present invention is to provide an easy and simple means for substrate contact bonding.

Briefly, the preferred embodiment of the present invention employs a preformed, metallic tape for thermocompression bonding to the electrical contact pads of electronic component chips. The metallic tape is formed with a plurality of chip bonding sites, each site including a central, pull-tab region surrounded by a frame region. Also formed within the chip bonding site, intermediate the central pull-tab region and the frame region, are electrically conductive leads. All of the electrically conductive leads are connected to the central, pull-tab region. Each lead contains a contact pad terminal end region located near the central pull-tab region and separated therefrom by means of a narrow neck region. For a rectangularly-shaped central, pull-tab region, the four leads located at the corners thereof are further connected to the frame region surrounding the central, pull-tab region. Thus, these four leads connected to the frame region support the central, pull-tab region and the leads connected thereto within the frame region. All electrically conductive leads further include a second bonding region located further from the central, pull-tab region along their length than their contact pad terminal end region. These second bonding regions may be used to attach the electrically conductive leads to either a lead frame or a chip carrier frame of a type well known in the art. The preformed metallic tape further includes a first, smooth bonding surface for bonding to the electrical contact pads of electronic component chips. The opposite side of this tape is a pressure pad surface from which protrude a plurality of mushroom-shaped pressure pads. These pads are located in regions of the electrically conductive leads to be bonded to the electrical contact pads of the electronic component chip or to a lead frame or chip carrier frame. The pressure pads located at the contact pad terminal end regions are positioned immediately adjacent to the narrow neck regions of the electrically conductive leads to the central, pull-tab region.

The preformed metallic tape is preferably fabricated from the same material as that employed to fabricate the electrical contact pads on the electronic component chip. Thus the mechanical properties of both materials employed in the electrically conductive bond, particularly the coefficient of thermal expansion, will match precisely. If aluminum is chosen for the preformed metallic tape, a strip having a thickness of seven ten thousandths of an inch is generally used. The patter within a frame region of the tape may be fabricated by well known processes of photolithography and etching. Similarly photolithography and electrochemical plating may be employed to form the pressure pads. Regardless of how formed, the pressure pad material must be harder than the metallic tape material in the thermocompression bonding temperature range so the pressure pads will not deform significantly during bonding. For most, if not all, material combinations of interest for the metallic tape and pressure pads, this requirement that the pressure pad material be harder in the thermocompression bonding temperature range than the metallic tape material may be alternatively stated as the pressure pad material must be harder and have a higher melting temperature than the metallic tape material.

An electronic component chip is first prepared for bonding to this preformed metallic tape by positioning the electrical contact pads of the chip adjacent to the bonding surface of the tape. The electrical contact pads are then aligned with mating contact pad terminal end regions in a chip bonding site of the preformed tape. The tape and chip are then secured to preserve this alignment. Thus aligned, the electrical contact pads on the surface of the electronic component chip are then pressed into intimate contact with the bonding surface of the metallic tape. The force thus applied to the chip and the tape causes the pressure pads to contact a heated anvil. If an aluminum tape is being used, the anvil is preferably heated to approximately 400 degrees centrigrade. The heat thus applied to the pads is conducted into the contact pad terminal end regions of the electrically conductive leads. At this elevated temperature the electrically conductive leads and the electrical contact pads of the electronic component chip soften. Since the pressure pads are formed from a material which is harder at the thermocompression bonding temperature than the material of the tape, they also apply a force to the softened, electrically conductive leads and the electrical contact pads urging them together in intimate mechanical contact. This intimate contact causes the material of the leads and pads to share electrons between latices of bonded components. This same process of pressing and heating may then also be employed to bond the second bonding regions of the electrically conductive leads to either electrically conductive leads in a lead frame or to bonding points in a preformed chip carrier frame. After the leads are bonded to either of these types of frames, the connection between the electrically conductive leads and the frame region of the chip bonding site in the metallic tape are broken by pulling on the preformed metallic tape. Thus, the electronic component chip is now joined to the electrically conductive leads and the central pull-tab region. Further, the bonded chip and electrical conductive leads are now supported by either a lead frame or a chip carrier frame.

If an electrical connection is to be made to the substrate of the electronic component chip, a bonding surface of a second, preformed substrate contact metallic tape is then positioned immediately adjacent to a substrate contact. This substrate contact may be simply a metallic coating deposited on the surface of the chip immediately opposite to the electrical contact pad surface thereof. This substrate contact metallic tape, fabricated in the same manner as the first preformed metallic tape, also has a pressure pad surface opposite to the bonding surface from which also protrude pressure pads. A substrate contact terminal end of an electrically conductive lead located within a substrate bonding site in the substrate contact tape is then aligned with the electrically substrate contact on the electronic component chip. Thus aligned, both the substrate contact tape and the chip are secured and an anvil is brought into contact with the pressure pads protruding from the substrate contact metallic tape. A force applied by this anvil causes the pressure pads protruding from the electrically conductive leads already bonded to the electronic component chip to again contact the heated anvil. Sufficient heat is conducted through these pressure pads, the bonded electrically conductive leads and electrical contact pads and the substrate of the electronic component chip to soften the material of both the substrate contact and the substrate contact metallic tape allowing a thermocompression bond to be formed therebetween. In a manner similar to the electrically conductive leads bonded to the electrical contact pads, a second bonding region of this electrically conductive lead may then also be bonded to either a lead frame or a chip carrier frame.

The chip thus bonded is now ready for electrical isolation of the conductive leads by removal of the central, pull-tab region to which they are connected. Removal of the central, pull-tab region is performed by first urging the pressure pad surface of the preformed metallic tape and the periphery of the bonded electronic component chip against a semi-resilient lead forming tool. This force is first applied by a pin contacting the surface of the electronic component chip opposite to the electrical contact pads and then subsequently increased by further contacting that same surface with a piece of foamed resilient material surrounding the pin. The semi-resilient tool contacting the pressure pad surface of the electrically conductive leads is shaped such that the deformation of the foamed material cause that portion of the electrically conductive leads not bonded to the electronic component chip to be bent away from the surface thereof. With the electronic component chip thus secured against the semi-resilient tool, a piece of single-sided adhesive tape wrapped around the end of a mandrel is inserted through an aperture formed in the tool to expose the central, pull-tab region. This adhesive tape then contacts the central, pull-tab region and adheres thereto. Electrical isolation of the electrically conductive leads is finally completed by drawing the mandrel and adhesive tape away from the bonded electronic component chip. This causes the narrow neck regions intermediate the contact pad terminal end regions of the electrically conductive leads and the central, pull-tab region to break. The electronic component chip now bonded to electrically insulated leads and secured to either a lead frame or a chip carrier frame is now ready for further packaging operations.

An advantage of the bonding method of the present invention is that it provides a simpler means of attaching electrically conductive leads to electrical contact pads of an electronic component chip.

Another advantage of the chip bonding method is that an insulating backing is not required for the preformed metallic tape.

Another advantage is that layers of precious metals need not be incorporated into the bond between the electrically conductive lead and the electrical contact pad.

Still another advantage of the chip bonding method is that additional contact pad processing steps are not required.

Another advantage of the chip bonding method is that the electrically conductive leads do not require a specially formed bonding surface.

Yet another advantage is that the same material may be used both for the electrically conductive leads and the electrical contact pads on the electronic component chip.

A further advantage of the present invention is that it provides a simple means for substrate contact bonding.

These and other objects and advantages of the present invention will no doubt become obvious to those of ordinary skill in the art after having read the following detailed description of the preferred embodiments as illustrated in the various drawing figures.

IN THE DRAWING

FIG. 1 is an exploded perspective view of bonding electrically conductive leads in a preformed metallic tape between an electronic component chip and a lead frame in accordance with the present invention;

FIG. 2 is a sectional view of the preformed metallic tape taken along the line 2—2 of FIG. 1;

FIG. 3 is a cross-sectional view of an electrically conductive lead and a pressure pad taken along the line 3—3 of FIG. 2;

FIG. 4 is a cross-sectional view of an electronic component chip being bonded to a lead frame taken along the line 4—4 of FIG. 1;

FIG. 5 is a cross-sectional view of a bonded electrical contact pad and electrically conductive lead taken along the line 5—5 of FIG. 4;

FIG. 6 is a perspective view of the electronic component chip and lead frame of FIG. 1 after bonding;

FIG. 7 is a cross-sectional view of substrate contact bonding to the bonded electronic component chip of FIG. 1 in accordance with the present invention;

FIG. 8 is a perspective view of an electronic component chip bonded to a chip carrier frame in accordance with the present invention;

FIG. 9 is a cross-sectional view of the bonded electronic component chip of FIG. 1 prior to lead forming;

FIG. 10 is a cross-sectional view of the bonded electronic component chip of FIG. 1 after lead forming and prior to removal of the central, pull-tab region;

FIG. 11 is a cross-sectional view of the bonded electronic component chip of FIG. 1 undergoing removal of the central, pull-tab region; and FIG. 12 is a cross-sectional view of the bonded electronic component chip of FIG. 1 after removal of the central, pull-tab region.

DETAILED DESCRIPTION OF THE PREFERRED EMBODIMENTS

FIG. 1 illustrates an electronic component chip, referred to by the general reference number 20, being bonded in accordance with the present invention. The electronic component chip 20 has an electrical contact pad surface 22 on which are formed a plurality of electrical contact pads 24. The surface of the electronic component chip 20 opposite to the electrical contact pad surface 22, not visible in FIG. 1, is designated as substrate surface 26.

Bonding the electronic component chip begins by positioning a lead frame referred to by the general reference number 30 with respect to a reference position 32 along a path 34. The lead frame 30 may be chosen from a number of types well known in the art for bonding electronic component chips. (For example, the lead frame 30 may be of the type described in U.S. Pat. No. 3,698,074 issued to Robert W. Helda, at Column 4 starting with line 14). The lead frame 30 includes a plurality of electrically conductive leads 36. Each electrically conductive lead 36 has a bonding terminal end 38 located in close proximity to the electronic component chip 20 when the lead frame is in proper position.

A preformed metallic tape in accordance with the present invention and referred to by the general reference number 40 is then positioned along a path 42 adjacent to and parallel to the plane of the lead frame 30. The preformed metallic tape 40 has a bonding surface 44, not visible, immediately adjacent to the plane of the lead frame 30 and a pressure pad surface 46 opposite from the surface 44. Formed in the tape 40 is a chip bonding site 50 having a central, pull-tab region 52 surrounded by a frame region 54. The chip bonding site 50 also has a plurality of electrically conductive leads 56 formed intermediate the central, pull-tab region and the frame region 54. All electrically conductive leads 56 are formed connected to the central, pull-tab region 52 by narrow neck regions 58. Immediately adjacent to the narrow neck regions 58 are contact pad terminal end regions 60 of the electrically conductive leads 56. Further along the length of the electrically conductive lead 56 from the central, pull-tab region 52 is a second, lead frame terminal end region 62. Further yet along the length of the leads 56, some of the electrically conductive leads 56 are also connected to the frame region 54 by a carrier bonding region 64. Intermediate the lead frame terminal end region 62 and the carrier bonding region 64 is a narrow neck region 66. Similarly, intermediate the carrier bonding region 64 and the frame region 54 is another narrow neck region 68. At least two electrically conductive leads 56 are connected by carrier bonding region 64 to the frame region 54 to support the central pull tab region. In the preferred embodiment of this invention for bonding to rectangular electronic component chips 20, four electrically conductive leads 56 connected respectively to the four corners of the central, pull-tab region 52 are so joined to the frame region 54. The central, pull-tab region 52, the frame region 54 and the intermediate electrically conductive leads 56 of the chip bonding site 50 may be formed into a strip of metallic tape 40 by means of the well known processes of photo-lithography and wet chemical etching.

As shown in FIG. 2, the contact pad terminal end regions 60 of the electrically conductive leads 56 are formed to have a width "$W_p$" which is approximately equal to the width of the electrical contact pads 24. In the preferred embodiment, the narrow neck regions 58 have a width "$W_n$" which is approximately one-half that of "$W_p$" which is the width of the contact pad terminal end regions 60. The electrically conductive leads 56 formed to be bonded to electrically conductive pads 24 closest to the corners of electronic component chips 20 are preferably disposed so that the contact pad terminal end regions 60 thereof pass diagonally across the pads 24 of properly aligned chips 20. Thus, the contact pad terminal end regions 60 of these corner electrically conductive leads 56 may be preferably formed with triangular shaped regions 70 protruding from opposite sides of the leads 56. The triangular regions 70 are located and formed so as to align with the corners of mating electrically conductive pads 24 of properly aligned chips 20. Thus, the triangular regions 70 of a pair of diagonally opposite electrically conductive leads 56 may be employed as reference marks to assist alignment of all the electrically conductive pads 24 of the electronic chip 20 with the contact pad terminal end regions 60 of all electrically conductive leads 56 in the chip bonding site 50.

Projecting from the pressure pad surface 46 of the preformed metallic tape 40 at each contact pad terminal end region 60, each lead frame terminal end region 62 and each carrier bonding region 64, is a pressure pad 72 similar to that shown in FIG. 2 and FIG. 3. The pressure pads are formed from a material which is harder in the thermocompression bonding temperature range than the material of the metallic tape 40. The pressure pads 72 may be formed by plating onto the pressure pad surface 46 through a layer of exposed and developed photo resist material, not shown, as is well known in the art. As shown in FIG. 3, the pressure pad 72 is formed to have a height, "H", substantially equal to the thickness, "T", of the metallic tape 40. Because the layer of photo resist material through which the pressure pad 72 is plated is much thinner than the height "H", the pressure pad 72 becomes mushroom shaped, having a narrow stem region 74. One terminal end of the stem region 74 is in intimate contact with the pressure pad surface 46 of the metallic tape 40. The other end of the pressure pad 72 has a cap region 76 which is farthest from the metallic tape 40. In the preferred embodiment, the pressure pads 72 at the contact pad terminal end regions 60 of the electrically conductive leads 56 are located immediately adjacent to the narrow neck regions 58. The contact pad terminal end region 60 of the electrically conductive leads 56 usually have single pressure pads 72 due to their small width "$W_p$". The lead frame terminal end regions 62 and carrier bonding regions 64 which may be made much larger than the contact pad terminal end regions 56 usually have three or more pressure pads 72. The stem regions 74 of the pressure pads 72 are preferrably formed with a diameter approximately equal to the width of the narrow neck regions 58 and located immediately adjacent thereto in the contact pad terminal end regions 60 of the electrically conductive leads 56. This diameter and location for the stem regions 74 tends to reduce the cross-sectional area of the narrow neck regions 58 during thermocompression bonding thus reducing the force applied to the electrically conductive lead 56 during removal of the central, pull-tab region 52.

After being guided along the path 42 disposed immediately adjacent to the lead frame 30, as shown in FIG. 1, the preformed metallic tape 40 is positioned so that lead frame terminal end regions 62 align respectively with mating terminal ends 38 of electrically conductive leads 36. Alignment of the electrically conductive leads 36 with the bonding terminal ends 38 may be assisted by use of reference indicators 78 incorporated into the frame region 54 of the preformed tape 40 or by means of an alignment aperture 80 formed through the central, pull-tab region 52. With the preformed metallic tape 40 located in this position, the cap terminal end region 76 of the pressure pad 72 are positioned above and immediately adjacent to a face 82, not visible in FIG. 1, of a heated anvil 84. The anvil 84 must be heated to a temperature at which the material of the electrical contact pads 24 and the metallic tape 40 will soften to form a thermocompression bond. In the preferred embodiment, wherein the preformed metallic tape 40 is fabricated from aluminum as are the contact pads 24, the anvil 84 is heated to a temperature greater than 350 degrees centigrade and preferably to no less than 400 degrees centigrade. The electronic component chip 20 is then positioned so that the electrical contact pad surface 22 is adjacent to and parallel to the bonding surface 44 of the preformed metallic tape 40 and so that the electrical contact pads 24 align respectively with contact pad terminal end regions 60 of the electrically conductive leads 56. The substrate surface 26 is then contacted by and secured to a vacuum chuck terminal face 86 of a cylindrical anvil 88 located above the electronic component chip 20.

Thus secured, the electronic component chip 20 is lowered so that the electrical contact pads 24 enter into intimate contact with the bonding surface 44 of the contact pad terminal end regions 60, as shown in FIG. 4. As shown in FIG. 5, the force thus applied to the bonding surface 44 urges the cap terminal end 76 of the pressure pad 72 into intimate contact with the face 82 of the heated anvil 84. Heat from the anvil 84 is thus conducted through the pressure pad 72 into the contact pad terminal end region 60 of the electrically conductive lead 56 and then into the electrical contact pad 24 of the electronic component chip 20. Thus heated and compressed by the force applied respectively to the substrate surface 26 or the electronic component chip 20 and the cap terminal end 76 of the pressure pad 72, the material of the electrical contact pad 24 and the contact pad terminal end region 60 are mechanically forced into intimate contact and deformed thus establishing a thermocompressive mechanical as well as electrically conductive bond. The force applied to the cap terminal ends 76 of the pressure pads 72 during bonding is in the range of 20 to 100 grams force per pressure pad.

In a similar manner, the terminal ends 38 of the electrically conductive leads 36 of the lead frame 30 are bonded to the lead frame terminal end region 62 of the electrically conductive leads 56 by compressive force applied thereto by means of a face 92 of a second, square-shaped anvil 94 surrounding the cylindrical anvil 88. To compensate for normal manufacturing variations in the thickness of the electronic component chip 20 and the preformed metallic tape 40 including the height "H" of the pressure pads 72, the face 82 of the heated anvil 84 is oscillated so as to tilt with respect to the contact pad surface 22. This oscillation of the face 82 assures that a force sufficient to form a thermocompression bond is applied to all of the cap terminal ends 76 of the pressure pads 72 despite these normal variations in thicknesses.

Thus, as shown in FIG. 6, the electronic component chip 20 is now bonded to the electrically conductive leads 56 which are in turn bonded to the electrically conductive leads 36 of the lead frame 30. Thus bonded, the lead frame terminal end regions 62 of the electrically conductive leads 56 may be pulled free of the preformed metallic tape 40 at the narrow neck regions 66. At this point in the bonding of the component chip 20, the electrically conductive leads 56 are still joined to the central, pull-tab region 52 by the narrow neck regions 58. Thus, the electrically conductive leads 56 remain electrically shorted together.

An alternative embodiment of the present invention, shown in FIG. 7, permits formation of a substrate bond. Those elements of the substrate bonding embodiment of the present invention common to the electrical contact bonding embodiment carry the same reference numeral distinguished by a single prime designation. In this embodiment an electrically conductive lead 100 is positioned adjacent to the substrate surface 26' of the electronic component chip 20'. Similar to the electrically conductive leads 56 in the chip bonding site 50 of the preformed metallic tape 40, the electrically conductive lead 100 is formed in a substrate bonding site, not shown, in a preformed substrate contact metallic tape 102. Similar to the preformed metallic tape 40, the substrate bonding metallic tape 102 has a substrate bonding surface 104 and a pressure pad surface 106. Pressure pads 72' protrude from the pressure pad surface 106 respectively at a substrate contact terminal end 108 and a lead frame terminal end 110 of the electrically conductive lead 100. While the electrically conductive lead 100 may be bonded directly to a silicon substrate surface 26' of electronic component chips 20', it is preferred that the chip 20' be prepared for substrate bonding by being fabricated with a metallic coating 112 deposited on the substrate surface 26'.

Prior to bonding, the electrically conductive lead 100 is aligned so that the substrate contact terminal end 108 is over the substrate surface 26' and the lead frame contact terminal end 110 is adjacent to the terminal end 38' of the electrically conductive lead 36'. Aligned in this position, the electrically conductive lead 100 is bonded to the coating 112 by force applied thereto through the cap terminal end 76' of the pressure pad 72' by the anvil 88'. As before, application of this force causes the pressure pad 72' protruding from the metallic tape 40' to contact the heated anvil 84'. The thermal conductivities of the pressure pad 72', the metallic tape 40', and the electronic component chip 20' intervening between the heated anvil 84' and the substrate contact 112 are sufficient to permit formation of a thermocompression bond between the substrate contact 112 and the substrate contact terminal end 108 of the electrically conductive lead 100. Similarly, the lead frame contact terminal end 110 of the electrically conductive lead 100 may be bonded to the terminal end 38' of electrically conductive lead 36' by means of force applied with the anvil 92' and heat supplied from the anvil 84'.

Another alternative embodiment of the present invention, as shown in FIG. 8, is bonding to a chip carrier frame referred to by the general reference number 120. Those elements of the chip carrier frame bonding embodiment of FIG. 8 common to the lead frame bonding embodiment carry the same reference numerals distinguished by a double prime designation. The chip carrier frame 120 may be fabricated from materials similar to those used for the lead frame 30 and may be fabricated by techniques well known in the art. The chip carrier frame 120 has an open chip site 122 surrounded by a rectangular frame region 124. Projecting inward from the frame region 124 are a plurality of bonding points 126 to which the carrier bonding regions 64" of the electrically conductive leads 56" are bonded. Securing an electronic component chip 20" to a chip carrier frame 120 permits it to be easily and safely handled and adapts it for further packaging operations which may differ from those employed for chips 20 bonded to a lead frame 30.

As previously pointed out, the bonded electronic component chip 20 shown in FIG. 9 cannot function electrically because the central pull tab region 52 electrically shorts the conductive leads 56. Also, because of their proximity to the contact pad surface 22, the electrically conductive leads 56 may be in electrical contact with components of the chip 20 other than the electrical contact pads 24. Thus, it is both necessary to electrically isolate the leads 56 before the electronic component chip 22 may be placed in service and is desirable to form them away from the contact pad surface 22. These operations may be performed by positioning the pressure pad surface 46 attached to a bonded electronic component chip 20 immediately adjacent to a lead forming tool 130. The forming tool 130 includes a metal backing sheet 132 to which is secured to a layer of semi-resilient material 134 such as silicone rubber having a hardness of eighty durometers. The forming tool 130 is constructed with an aperture 136 passing therethrough for exposing the central, pull-tab region 52 of a bonded electronic component chip 20. The layer of semi-resilient material 134 is formed to have a raised boss 138 about the aperture 136 shaped so that it contacts unformed electrically conductive leads 56 only about their contact pad terminal end regions 60. The pressure pad surface 46 is urged upward to contact the layer of semi-resilient material 134 by means of a pressure assembly referred to by the general reference number 140. The pressure assembly 140 includes a body 142 having an aperture 144 formed therein to receive and retain a coil spring 146 and a pin 148. The pin 148, whose terminal end furthest from the body 142 first contacts the substrate surface 26 of the electronic component chip 20, is surrounded by a layer of resilient foamed material 150.

As shown in FIG. 10, continued upward travel of the assembly 140 causes the pin 148 to retract within the body 142 thus permitting the foamed material 150 between the electronic component chip 20 and the body 140 to be compressed while the remainder of the foamed material passes around the edges thereof. Thus deformed, the formed material 150 presses upward against the electrically conductive leads 56 to form them away from the contact pad surface 22 of the electronic component chip 20. After the leads 56 have been thus formed, a terminal end 160 of a mandril 162 around which is guided a segment of single sided adhesive tape 164 is inserted into the aperture 136 to contact the central, pull-tab region 52 as shown in FIG. 10. The adhesive surface of the tape 164 adheres to the central, pull-tab region 52 so that withdrawal of the tape, shown in FIG. 11, causes the pull-tab region 52 to break free of the electrically conductive leads 56 at the narrow neck regions 58 therebetween. This fracture is constrained to the narrow neck regions 58 due to their cross-sectional area as established by their initial design and as further reduced during bonding by the pressure pad 72 immediately adjacent thereto. The layer of semi-resilient material 134 in the forming tool 130 assists this fracture mode by preventing the contact pad terminal end region 60 of the electrically conductive lead 56 from peeling from the electrical contact pad 24. This forces the narrow neck region 58 and the pull-tab region 52 to stretch at a shallow angle with respect to the substrate surface 26. The adhesive tape 164 forms a bond with the pull-tab region 52 such that withdrawal thereof applies a force which is approximately ten to forty times greater than the force required to break a single narrow neck region 58. Since the narrow neck regions 58 do not fracture simultaneously, this technique for removing the central, pull-tab region 52 is applicable to electronic component chips 20 having a virtually unlimited number of electrical contact pads 24. Complete withdrawal of the mandril 162, as shown in FIG. 12, permits advancement of the adhesive tape 164 carrying with it the removed pull-tab region 52 and thus preparing the tape 164 for removal of the next pull-tab region 52. Retraction of the pressure assembly 140 releases the bonded electronic component chip 20 from the forming tool 130.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. An integral, preformed tape for thermocompression bonding comprising:

a tape of conductive material with first bonding surface and a pressure pad surface opposite to the bonding surface with a contact pad bonding pressure pad protruding from said pressure pad surface, said tape having formed thereon a chip bonding site wherein apertures are formed through said tape to establish longitudinal edges of an electrically conductive lead, said lead having a contact pad terminal end region for bonding to an electrical contact pad formed on a surface of an electronic component chip, said contact pad bonding pressure pad being formed from a material which is harder than said tape material in the thermocompression bonding temperature range and located so as to protrude from said pressure pad surface at said contact pad terminal end region.

2. The preformed tape of claim 1 wherein said chip bonding site has formed therein a plurality of electrically conductive leads, said leads having contact pad terminal end regions adapted to be respectively bonded to a plurality of electrical contact pads formed on a surface of an electronic component chip, said contact pad terminal end regions being also formed connected to a common, central, pull-tab region of said chip bonding site by means of a plurality of first neck regions located respectively intermediate said contact pad terminal end regions and said central, pull-tab region, a second terminal end region of a pair of said electrically conductive leads having said contact pad terminal ends thereof connected to substantially opposite sides of said central, pull-tab region being further formed connected to a frame region of said chip bonding site about said central, pull-tab region by means of a plurality of second neck regions located respectively intermediate said second terminal end regions and said frame region, all of said conductive leads not connected at a second terminal end region thereof to said frame region being connected to the rest of said tape only by said first narrow neck regions connecting said contact pad terminal end regions to said central, pull-tab region; and a plurality of contact pad bonding pressure pads protruding from said pressure pad surface and being formed from a material which is harder than said tape material in the thermocompression bonding temperature range, said contact pad bonding pressure pads being located so as to protrude respectively from said pressure pad surface of said tape at said contact pad terminal end region of each electrically conductive lead immediately adjacent to said first narrow neck region connecting said conductive lead to said central, pull-tab region.

3. The preformed tape of claim 2 further comprising a plurality of lead frame bonding pressure pads protruding from said pressure pad surface of said tape, said lead frame bonding pressure pads being also formed from a material which is harder than said tape material in the thermocompression bonding temperature range, said lead frame bonding pressure pads being located so as to protrude respectively from said pressure pad surface of said tape at said second terminal end region of said conductive leads.

4. The preformed tape of claims 1, 2 or 3 wherein said pressure pads are substantially mushroom-shaped having a stem with one terminal end thereof in intimate contact with said tape and the other terminal end engages a substantially flattened cap terminal end, said stem having a diameter substantially equal to said width of said first narrow neck region of said tape.

5. The preformed tape of claims 1, 2 or 3 wherein said pressure pads have a height perpendicular to said pressure pad surface of said tape which is substantially equal to said thickness of said tape perpendicular to said pressure pad surface thereof.

6. The preformed tape of claim 1 further comprising an alignment reference means for use in aligning said electrical contact pad of said electronic component chip with said corresponding contact pad terminal end region of said conductive lead.

7. The preformed tape of claim 2 wherein said cross-sectional area of said narrow neck regions are approximately one-half of said cross-sectional areas of said immediately adjacent contact pad terminal end regions of said conductive leads.

* * * * *